(12) United States Patent
Venkatraman et al.

(10) Patent No.: US 11,552,017 B2
(45) Date of Patent: Jan. 10, 2023

(54) TRENCH GATE TRANSISTORS WITH LOW-RESISTANCE SHIELD AND GATE INTERCONNECTS

(71) Applicant: SEMICONDUCTOR COMPONENTS INDUSTRIES, LLC, Phoenix, AZ (US)

(72) Inventors: Prasad Venkatraman, Gilbert, AZ (US); Gary Horst Loechelt, Tempe, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 69 days.

(21) Appl. No.: 17/248,426

(22) Filed: Jan. 25, 2021

(65) Prior Publication Data

US 2022/0238427 A1    Jul. 28, 2022

(51) Int. Cl.
*H01L 23/528* (2006.01)
*H01L 29/40* (2006.01)
*H01L 29/423* (2006.01)
*H01L 29/66* (2006.01)
*H01L 29/78* (2006.01)
*H01L 29/739* (2006.01)

(52) U.S. Cl.
CPC .......... *H01L 23/528* (2013.01); *H01L 29/401* (2013.01); *H01L 29/404* (2013.01); *H01L 29/407* (2013.01); *H01L 29/4236* (2013.01); *H01L 29/66348* (2013.01); *H01L 29/66734* (2013.01); *H01L 29/7397* (2013.01); *H01L 29/7813* (2013.01)

(58) Field of Classification Search
CPC .............. H01L 29/407; H01L 29/4236; H01L 29/7813; H01L 29/7397; H01L 29/66734; H01L 23/528
See application file for complete search history.

(56) References Cited

U.S. PATENT DOCUMENTS

| 7,915,672 | B2 | 3/2011 | Venkatraman |
| 8,013,387 | B2 | 9/2011 | Yedinak et al. |
| 8,530,304 | B2 | 9/2013 | Coppens et al. |
| 8,648,410 | B2 | 2/2014 | Coppens et al. |
| 9,293,526 | B2 | 3/2016 | Yedinak et al. |

(Continued)

*Primary Examiner* — Joseph C. Nicely
(74) *Attorney, Agent, or Firm* — Brake Hughes Bellermann LLP

(57) ABSTRACT

In a general aspect, a transistor can include a trench disposed in a semiconductor region and a gate electrode disposed in an upper portion of the trench. The gate electrode can include a first and second gate electrode segments. The transistor can also include a shield electrode having a first shield electrode portion disposed in a lower portion of the trench, and a second shield electrode portion orthogonally extending from the first shield electrode portion in the lower portion of the trench to the upper portion of the trench. The first shield electrode portion can be disposed below the first and second gate electrode segments, and the second shield electrode portion can being disposed between the first and second gate electrode segments. The transistor can also include a patterned buried conductor layer. The first and second gate electrode segments can be electrically coupled via the patterned buried conductor layer.

20 Claims, 13 Drawing Sheets

(56) References Cited

U.S. PATENT DOCUMENTS

| | | | |
|---|---|---|---|
| 10,388,783 B2* | 8/2019 | Rankila | H01L 29/407 |
| 10,600,905 B1 | 3/2020 | Venkatraman et al. | |
| 2002/0093112 A1 | 7/2002 | Nesbit et al. | |
| 2006/0209887 A1* | 9/2006 | Bhalla | H01L 29/7811 |
| | | | 257/E29.066 |
| 2007/0194374 A1* | 8/2007 | Bhalla | H01L 29/66734 |
| | | | 438/270 |
| 2010/0123187 A1* | 5/2010 | Burke | H01L 29/407 |
| | | | 257/330 |
| 2010/0123188 A1* | 5/2010 | Venkatraman | H01L 29/41766 |
| | | | 257/330 |
| 2014/0252466 A1 | 9/2014 | Loechelt | |
| 2018/0315846 A1* | 11/2018 | Bobde | H01L 29/41766 |
| 2020/0335622 A1* | 10/2020 | Hiyoshi | H01L 29/7803 |

* cited by examiner

TRENCH GATE TRANSISTORS WITH LOW-RESISTANCE SHIELD AND GATE INTERCONNECTS

TECHNICAL FIELD

This description relates to power transistors. More specifically, this disclosure relates to shielded trench gate transistors with local gate interconnects and low resistance shield (shield electrode) structures.

BACKGROUND

Power transistors (e.g., operating at 20 volts (V), or higher), such as power metal-oxide-semiconductor field-effect transistors (MOSFETs) with shielded gates and/or power insulated-gate bipolar transistors (IGBTs) with shielded gates are used in a number of applications. For instance, these applications can include automotive applications, use in power converters, industrial applications, consumer electronic applications, and so forth. In such devices, use of a shield electrode (e.g., in a lower portion of a trench, such as between a gate electrode and a backside drain or collector terminal) can reduce and/or prevent unwanted electrical coupling (e.g., capacitive coupling) between a drain terminal (of a FET) or a collector terminal (of an IGBT) and a gate terminal of an associated transistor.

In such applications, electrical resistance of the shield electrode can affect performance of the associated transistor, such as gate bounce, avalanche performance capability, and/or application efficiency (e.g., efficiency of an associated power converter including such transistors). As semiconductor technologies advance, associated device dimensions continue to shrink, which can (e.g., in such shielded gate devices) increase shield resistance, and that increased shield resistance can adversely affect device performance, such as adversely affect the operational properties noted above. In order to reduce shield resistance (e.g., shield electrode resistance), electrical contacts (e.g., from source or emitter signal metal) to a shield electrode can be made (e.g., added) to achieve a desired shield resistance.

However, adding such additional shield contacts can involve interrupting a corresponding gate electrode (e.g., dividing the gate electrode into a plurality of gate electrode segments) to accommodate such shield contacts. Such interruptions in the gate electrode can result in an increased number of metal gate runners being included in the device, e.g., in order to avoid floating gate segments, which can adversely affect the performance of an associated transistor. The increased number of gate runners can take up more area on the die, thus increasing the die size. The increased number of gate runners can also make it more complicated to package the device, since such gate runners interrupt the source metal, and make it more difficult to make a low resistance package interconnect (e.g., wire bond, or clip) to an associated source (emitter, etc.) terminal.

SUMMARY

In a general aspect, a transistor can include a semiconductor region, a trench disposed in the semiconductor region, and a gate electrode disposed in an upper portion of the trench. The gate electrode can include a first gate electrode segment and a second gate electrode segment. The transistor can further include a shield electrode having a first shield electrode portion disposed in a lower portion of the trench, and a second shield electrode portion orthogonally extending from the first shield electrode portion in the lower portion of the trench to the upper portion of the trench. The first shield electrode portion can be disposed below the first gate electrode segment and the second gate electrode segment. The second shield electrode portion can be disposed between the first gate electrode segment and the second gate electrode segment. The transistor can also include a patterned buried conductor layer. The first gate electrode segment can being electrically coupled with the second gate electrode segment via the patterned buried conductor layer.

Figure 1A:
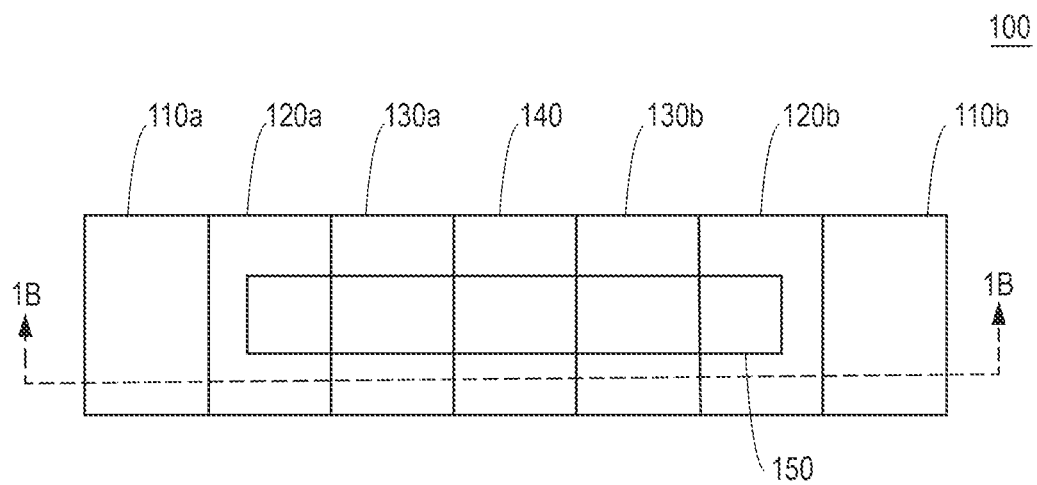
FIG. 1A is a block diagram that schematically illustrates a trench gate transistor.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of an element are illustrated in a given view.

DETAILED DESCRIPTION

The present disclosure is directed to trench gate transistors that can address at least some of the drawbacks noted above. For purposes of illustration and discussion, the examples illustrated herein are generally described with respect to shielded trench-gate field-effect transistors (FETs). In some implementations, the disclosed approaches can be used in conjunction with other types of transistors, such as insulated-gate bipolar transistor (IGBTs) with shielded gates. Also, in some implementations, the conductivity types discussed herein can be reversed (e.g., n-type and p-type conductivities can be reversed).

The implementations described herein can be used to implement shielded-gate transistors with both low shield resistance and low gate resistance, while preventing adverse effects on breakdown voltages of associated transistors. That is, the disclosed implementations can improve (e.g., for shielded trench-gate transistors) gate bounce, unclamped inductive switching performance, and/or device efficiency, without adversely impacting associated transistor breakdown voltages.

For instance, the approaches described herein include use of buried conductors (e.g. patterned buried conductor layers) to provide electrical interconnection (e.g., local interconnects) between gate electrode segments of a transistor (within a single trench and/or in multiple trenches), where shield contacts can be disposed between respective gate electrode segments of a given trench. As shown in the example implementations described herein, such a buried conductor layer can be formed using a single conductive material (single deposition). Formation of a buried conductor layer can also include an etch and/or a polishing process (e.g., a chemical-mechanical polishing process).

Such approaches allow for achieving both low shield electrode resistance and low gate electrode resistance, and the ability to individually adjust each of these resistances (e.g., based, respectively, on an arrangement of a patterned buried conductor layer and a number of shield contacts that are electrically coupled with a given shield electrode). That is, the approaches described herein allow for defining multiple shield contacts along the length of a corresponding shield electrode, while achieving a low gate resistance using a patterned buried conductor layer (e.g., for shield-gate structures disposed in linearly arranged trenches).

Figure 1B:
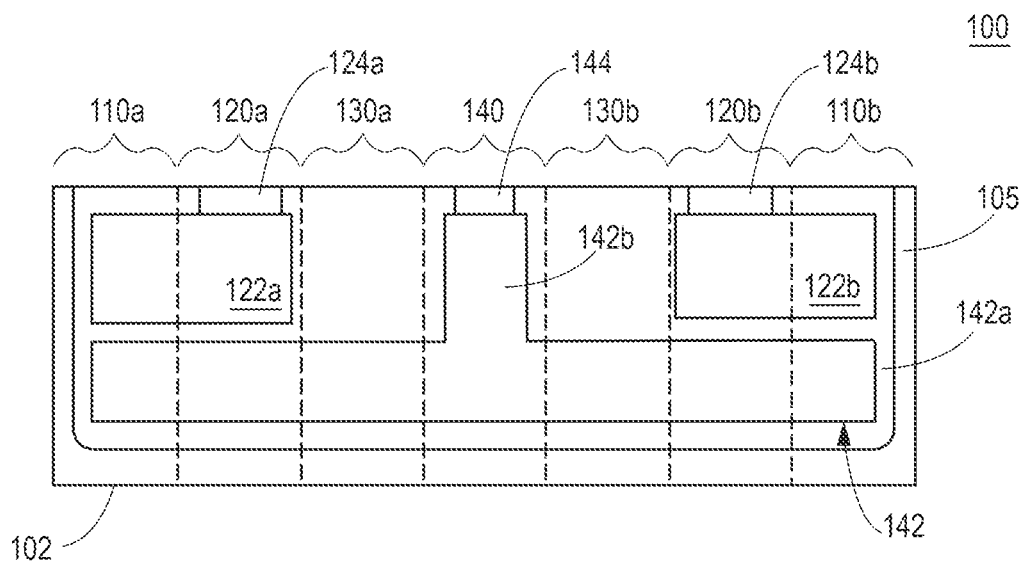
FIG. 1B is a block diagram that schematically illustrates a side cross-sectional view of the trench-gate transistor of FIG. 1A.

FIG. 1A is a block diagram that schematically illustrates a trench-gate transistor 100. FIG. 1B is a block diagram that schematically illustrates a side cross-sectional view of the trench-gate transistor 100 along section line 1B-1B in FIG. 1A. Accordingly, the transistor 100 is described with reference to both FIGS. 1A and 1B. As shown in FIG. 1B, the transistor 100 can be implemented in a semiconductor region 102, which can include one or more trenches that are disposed in the semiconductor region 102. For purposes of illustration, a trench 105 (single trench) is shown (in FIG. 1B) and described with respect to the transistor 100. However, in some implementations, the transistor 100 can include multiple trenches (e.g., such as the trench 105) that can be included in a single transistor device, such as parallel arranged trenches.

As shown in FIGS. 1A and 1B, the transistor 100 can include a first active region 110a disposed in the semiconductor region 102. In some implementations, the first active region 110a can include one or more active segments of the transistor 100 (e.g., vertical FET segments, vertical IGBT segments, etc.). The transistor 100 further includes a first gate contact region 120a disposed in the semiconductor region 102. The first gate contact region 120a, in this example, is adjacent to the first active region 110a. The transistor 100 also includes a first isolation region 130a disposed in the semiconductor region 102. In this example, the first isolation region 130a is adjacent to the first gate contact region 120a, while the first gate contact region 120a is disposed between the first active region 110a and the first isolation region 130a. The transistor 100 also further includes a shield contact region 140 that is disposed in the semiconductor region 102. In this example, the shield contact region 140 is adjacent to the first isolation region 130a, while the first isolation region 130a is disposed between the first gate contact region 120a and the shield contact region 140. As shown in further detail below, in some implementations, the first isolation region 130a can electrically isolate a gate electrode and associated gate contact in the first gate contact region 120a from a shield electrode and associated shield contact in the shield contact region 140.

As also shown in FIGS. 1A and 1B, the transistor 100 of this example, further includes a second active region 110b, a second gate contact region 120b, and a second isolation region 130b, which mirror (about the shield contact region 140) the first active region 110a, the first gate contact region 120a, and the first isolation region 130a. In some implementations, the pattern of the transistor 100 of FIG. 1A can be extended both vertically (e.g., by adding additional trenches), and/or horizontally (e.g., mirrored about the first active region 110a and/or the second active region 110b) to create larger transistor devices.

As shown in FIG. 1B. the trench 105 extends from the first active region 110a to the second active region 110b (e.g., through the gate contact regions 120a and 120b, the isolation regions 130a and 130b, and the shield contact region 140). In some implementations, where the transistor 100 (as shown in FIG. 1A) is extended horizontally (e.g., mirrored to the left and/or to the right), the trench 105 can extend from an active region disposed at a first end of the trench 105 to an active region disposed at a second (opposite) end of the trench 105. In some implementations, other regions can be disposed at ends of the transistor 100, such as a shield contact region, such as using shield contact structures as described herein.

As shown in FIG. 1B, the transistor 100 includes a gate electrode that is disposed in an upper portion of the trench 105. As shown in FIG. 1B, the gate electrode has multiple segments, e.g., a first gate electrode segment 122a and a second gate electrode segment 122b. In this example, the first gate electrode segment 122a extends from the first gate contact region 120a to the first active region 110a, while the second gate electrode segment 122b extends from the second gate contact region 120b to the second active region 110b. In some implementations, a gate electrode can include additional segments (such as in implementations where the pattern of the various regions of the transistor 100 (e.g., as shown in FIG. 1A) is extended to the left and/or right, such as discussed above.

As shown in FIG. 1A, the transistor 100 can also include a patterned buried conductor layer 150, which can be used to electrically couple the first gate electrode segment 122a to the second gate electrode segment 122b (as well electrically couple additional gate electrode segments included in the transistor 100 into a signal gate electrode node). The patterned buried conductor layer 150 allows for implementing shield contacts, such as described herein. While the patterned buried conductor layer 150 is not specifically shown in FIG. 1B, example implementations of such a patterned buried conductor layer are described in further detail below, e.g., with respect to, at least, FIGS. 4-7. In this example, the first gate electrode segment 122a can be electrically coupled (e.g., further into the page) with the patterned buried conductor layer 150 via, at least, a gate contact 124a (e.g., an Ohmic contact), while the second gate electrode segment 122b can be electrically coupled (e.g., further into the page) with the patterned buried conductor layer 150 via, at least a gate contact 124b (e.g., using the approaches described herein).

As also shown in FIG. 1B, the transistor 100 further includes a shield electrode 142 that is disposed in the trench 105. In this example, the shield electrode 142 includes a first shield electrode portion 142a that is disposed in a lower portion of the trench 105. For instance, the first shield electrode portion 142a is disposed, in the arrangement shown in FIG. 1B, below the first gate electrode segment 122a and the second gate electrode segment 122b. The first shield electrode portion 142a, in this example, extends from the first active region 110a to the second active region 110b. In implementations where the pattern of the transistor 100 is extended (e.g., to the left and/or to the right, to include additional active, gate contact, isolation and shield contact regions), the first shield electrode portion 142a can extend from a first end of an associated trench to an opposite end of that trench.

The shield electrode 142 of the transistor 100 also includes a second shield electrode portion 142b (in the shield contact region 140), which extends (orthogonally) from the first shield electrode portion 142a toward (into) the upper portion of the trench 105. As shown in FIG. 1B, an electrical contact 144 (e.g., an Ohmic contact) can be made to the second shield electrode portion 142b in the shield contact region 140. In some implementations, the electrical contact 144 can electrically couple a signal metal layer to the shield electrode 142 (e.g., to the second shield electrode portion 142b), where the signal metal can be, e.g., source metal (of a FET), emitter metal (of an IGBT), etc., and can provide a bias (e.g., electrical ground) to the shield electrode 142. Examples of such implementations are described further below. In implementations where the pattern of the transistor 100 is extended (e.g., to the left and/or to the right, to include additional active, gate contact, isolation and shield contact regions), the shield electrode 142 can include multiple orthogonal portion (e.g., such as the second shield electrode portion 142b), which can be electrically coupled to signal metal (e.g., source or emitter metal), e.g., to reduce resistance of the shield electrode 142.

As can be seen in FIG. 1B, the second shield electrode portion 142b can be electrically isolated from the first gate electrode segment 122a and the second gate electrode segment 122b, respectively, by the first isolation region 130a and the second isolation region 130b. As discussed herein, the first isolation region 130a and the second isolation region 130b can include a dielectric material that provides such electrical isolation.

Figure 2:
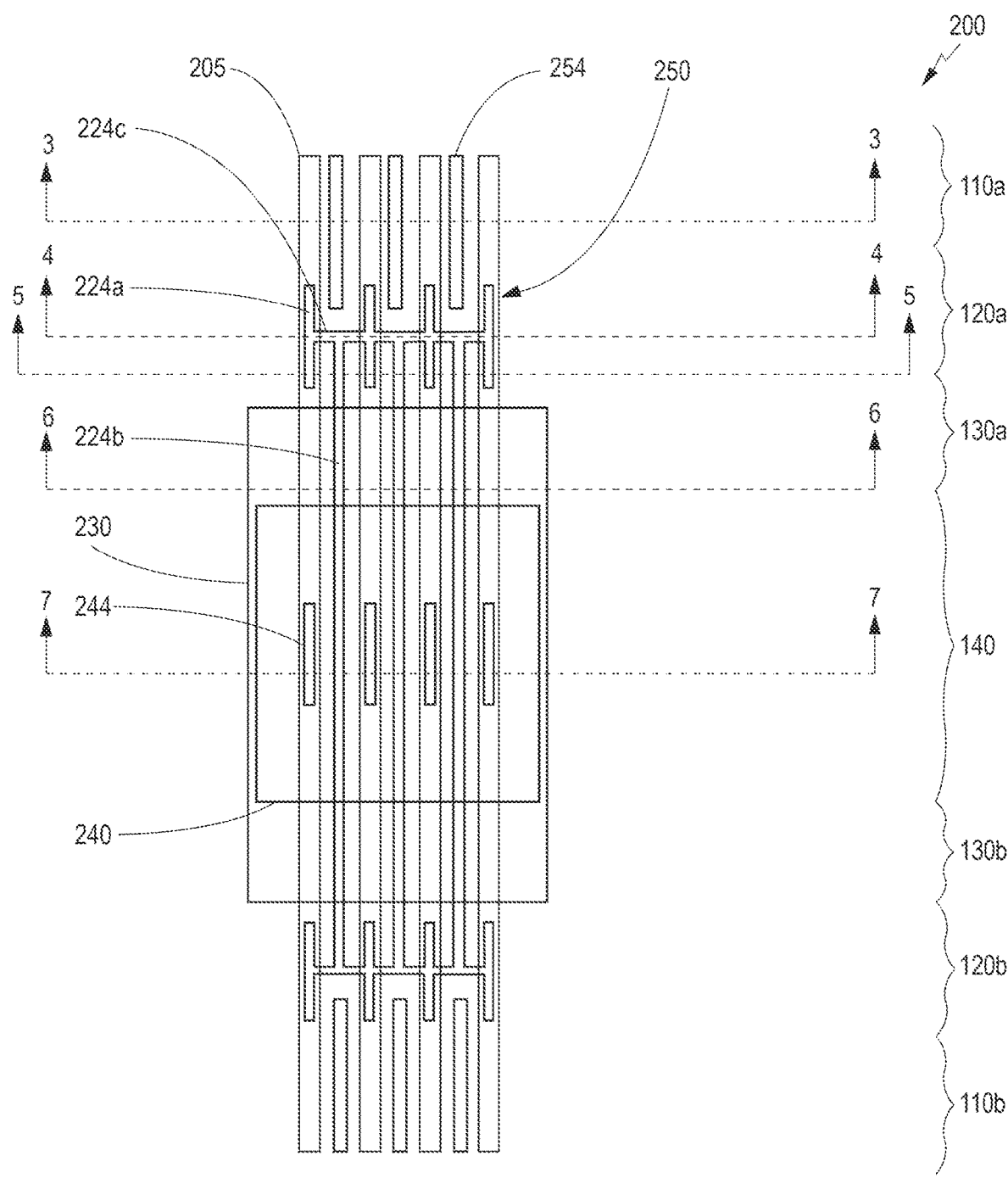
FIG. 2 is a diagram illustrating a plan (top layout) view of a portion of a trench-gate field-effect transistor (FET).

FIG. 2 is a diagram illustrating a plan (top layout) view of a trench-gate field-effect transistor (a FET 200), which can be an implementation of the transistor 100 of FIGS. 1A and 1B. Specifically, FIG. 2 illustrates a masking layout view that indicates various masking layer (e.g., photolithography masks) that can be used to produce a trench-gate FET (e.g., such as in accordance with the examples of FIGS. 3-12D). In this example, the FET 200 is rotated 90 degrees clockwise from the orientation of the transistor 100 as shown in FIG. 1A. For correlation and/or comparison with FIGS. 1A and 1B, the active regions 110a and 110b, the gate contact regions 120a and 120b, the isolation regions 130a and 130b, and the shield contact region 140 are also indicated in FIG. 2. FIG. 2 also includes section lines 3-3, 4-4, 5-5, 6-6 and 7-7, which correspond with the sectional views shown in respectively, FIGS. 3, 4, 5, 6 and 7. While some similar features in FIG. 2 (such as contacts) are indicated using different reference numbers in FIG. 2, in some implementations, such features can be included in (formed using) a single masking layer. For instance, a single contact mask layer can be used to define different contact openings, such as for gate contacts, shield contacts, and/or source and body contacts.

As shown in FIG. 2, a first masking layer can be used to define trenches 205 of the FET 200. Shield electrodes, gate electrodes and dielectric layers disposed in the trenches 205 can be defined using a number of masks. For instance a mask 230 can be used to define a region where a dielectric(s) is(are) formed that electrically isolates gate electrodes of the FET 200 from the shield electrode and shield contacts of the FET 200. A mask 240 can be used to define where a conductive material used to form a shield electrode (e.g., doped polysilicon, silicide, metal, etc.) is not removed in the shield contact region 140 of the FET 200 (e.g., such as the second shield dielectric portion 142b and the shield contact 144 of FIG. 1B). The mask 240, as a result, can also further define, at least in part, the areas of the trenches 205 where isolation dielectric is formed (e.g., in isolation regions 130a and 130b) and where gate electrode segments are formed (e.g., in the gate contact regions 120a and 120b, and in the active regions 110a and 110b).

FIG. 2 also illustrates a masking layer that can be used to define (form, produce, etc.) a patterned buried conductor layer 250 that can be used to electrically couple gate electrodes of the FET 200 to each other. For instance, electrical contacts 224a can be formed to couple the patterned buried conductor layer 250 with respective gate electrodes in the trenches 205. In some implementations, the buried conductor layer 250 (including the electrical contacts 224a) can be formed using a single conductive material (single deposition). Formation of the buried conductor layer 250 (and/or the electrical contacts 224a) can also include an etch and/or a polishing process (e.g., a chemical-mechanical polishing process).

As shown in FIG. 2, the patterned buried conductor layer 250 can also include interconnecting segments 224b and 224c, which can be used to electrically couple gate electrodes in the first active region 110a together (via the interconnecting segments 224c), as well as couple gate electrodes of the second active region 110b with the gate electrode of the first active region 110a (via the interconnecting segments 224c). As shown in FIG. 2, the interconnecting segments 224b, in this example, are laterally (horizontally, etc.) spaced from the trenches 205. That is, the interconnecting segments 224b are not vertically aligned with (not disposed above, etc.) the trenches 205. As illustrated and described further below the electrical contacts 224a, the interconnecting segments 224b, and/or the interconnecting segments 224c can be formed from a single conductive material layer. That is, the interconnecting segments 224b and the interconnecting segments 224c can be patterned portions of a single conductive material layer (deposit, etc.). Accordingly, this allows for low resistance interconnects between gate electrode segments that are defined by placement of shield contacts without using intersecting trenches. As noted above, such an arrangement can reduce a combined gate electrode resistance, while allowing for implementation of shield contacts 244 along a linear trench, for which a corresponding masking layer is shown in FIG. 2.

Figure 3:
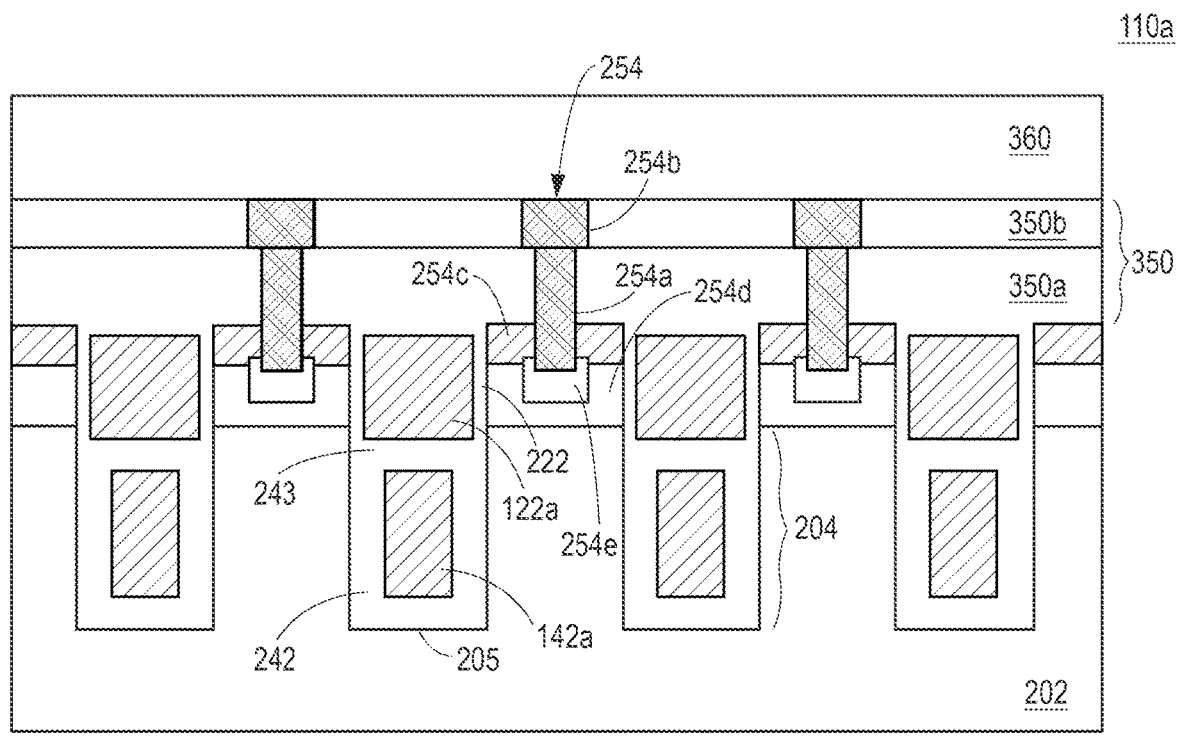
FIGS. 3-7 are diagrams illustrating cross-sectional views of an implementation of the FET of FIG. 2 along respective section lines.
Figure 4:
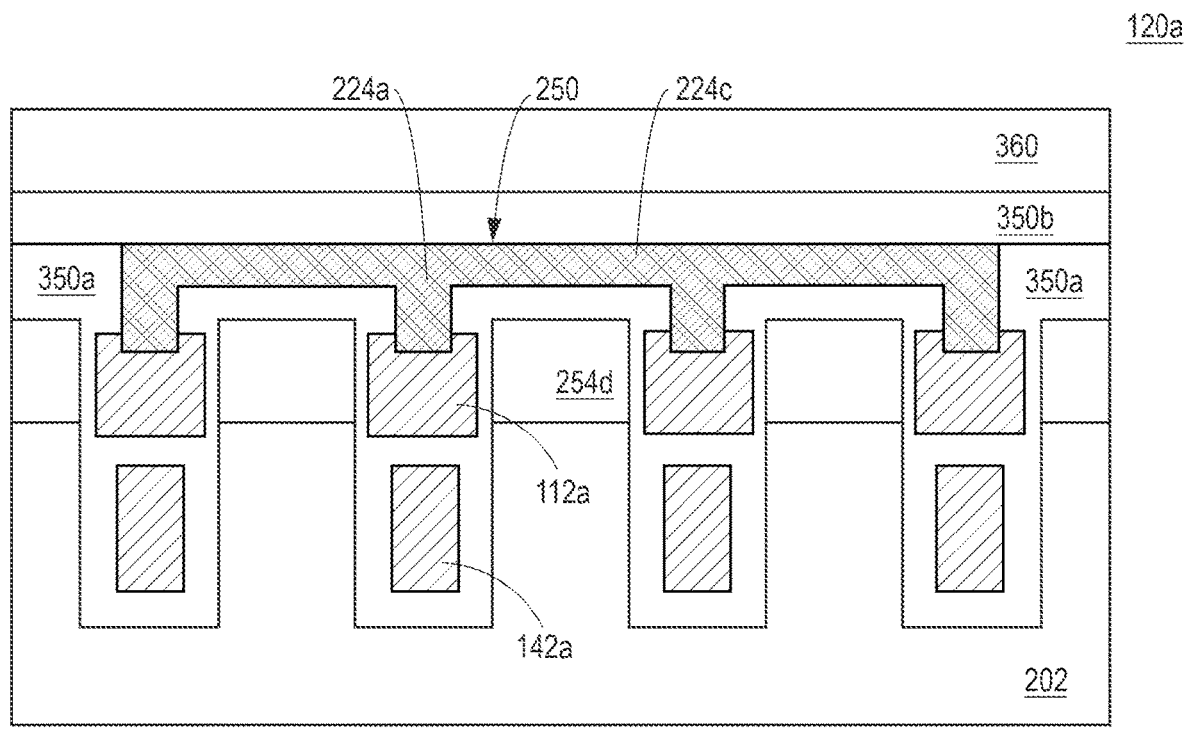
Figure 5:
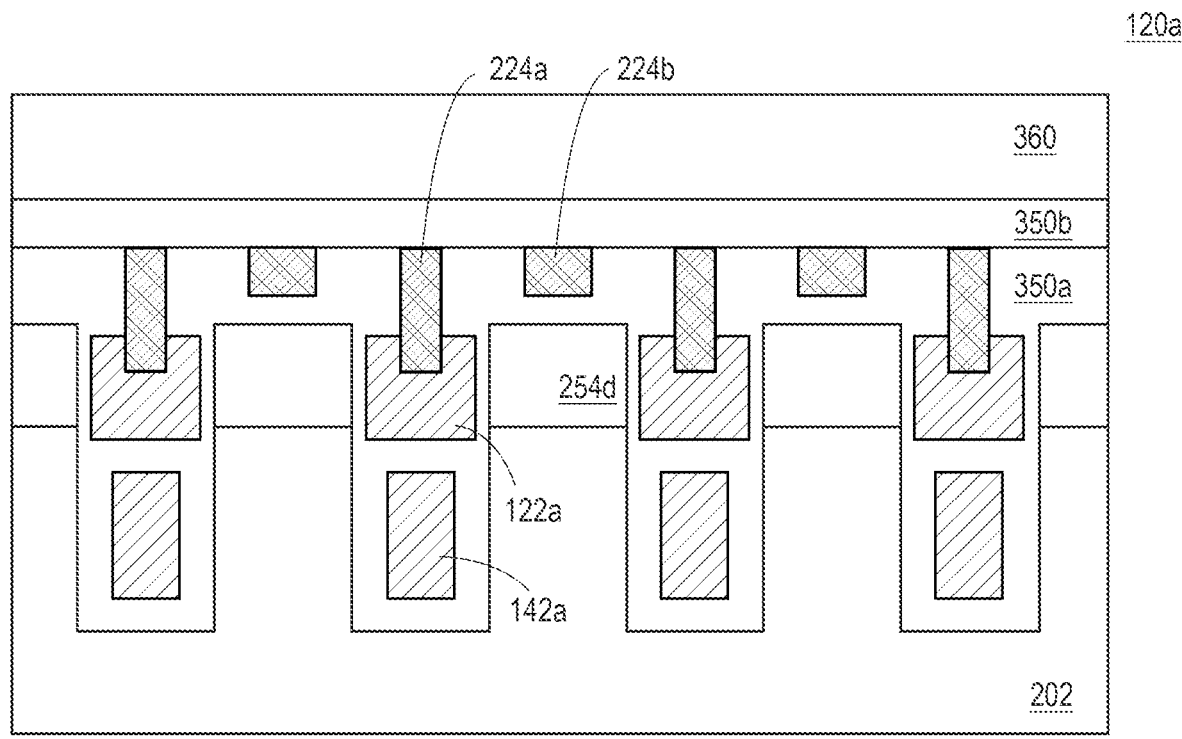
Figure 6:
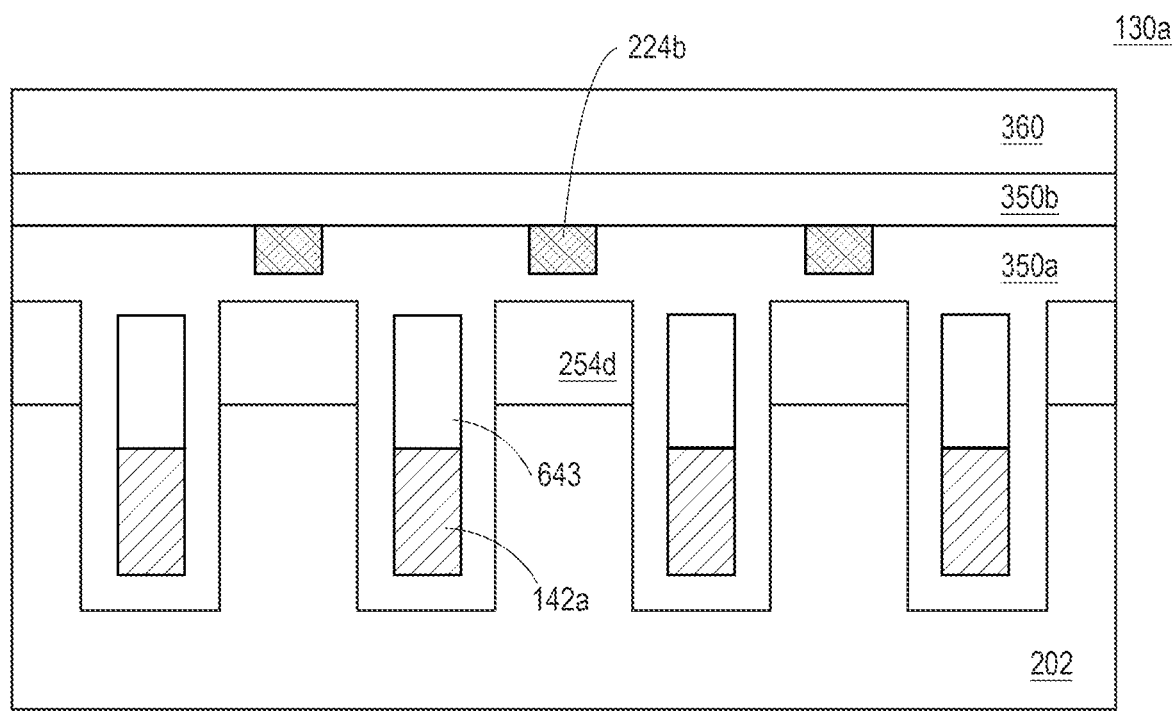
Figure 7:
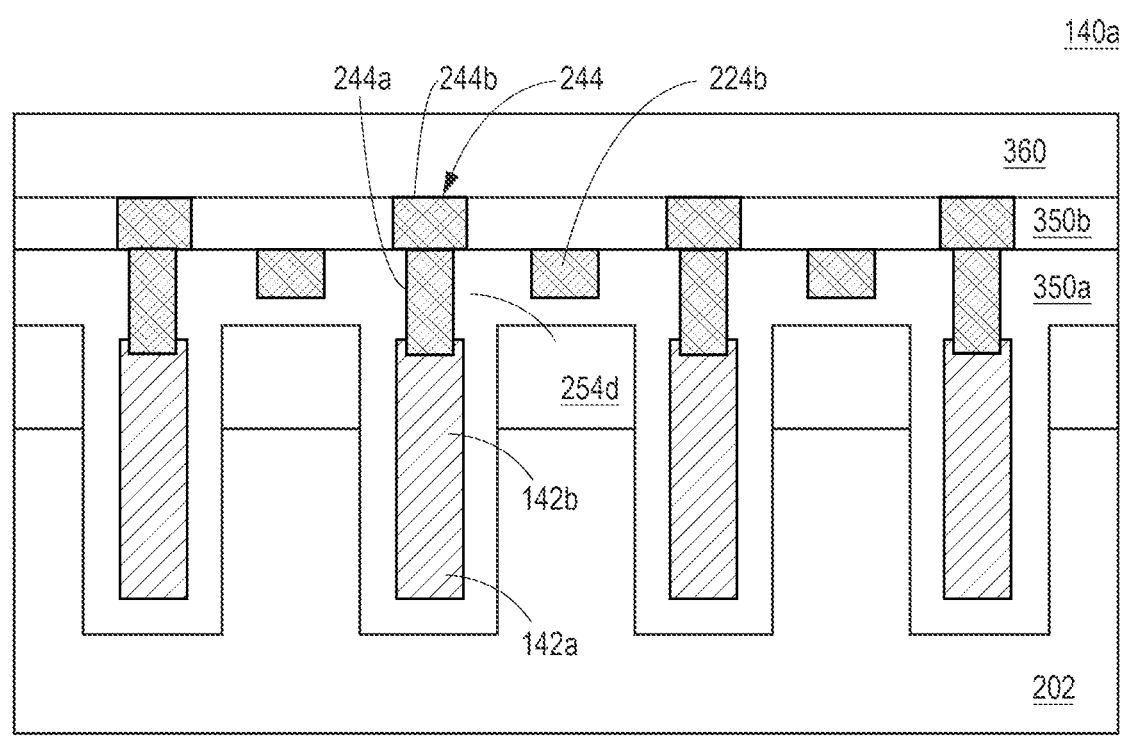

FIGS. 3-7 are diagrams illustrating cross-sectional views of an implementation of the FET 200 of FIG. 2 along respective section lines. Specifically, FIG. 3 illustrates a cross-sectional view of the FET 200 in the active region 110a along the section line 3-3 in FIG. 2. FIG. 4 illustrates a cross-sectional view of the FET 200 in the first gate contact region 120a along the section line 4-4 in FIG. 2. FIG. 5 illustrates a cross-sectional view of the FET 200 in the first gate contact region 120a along the section line 5-5 in FIG. 2. FIG. 6 illustrates a cross-sectional view of the FET 200 in the first isolation region 130a along the section line 6-6 in FIG. 2. FIG. 7 illustrates a cross-sectional view of the FET 200 in the shield contact region 140 along the section line 7-7 in FIG. 2. Each of the views of FIGS. 3-7 is referenced with the reference number of its respective region (active, gate contact, isolation, shield contact) of the FET 200 of FIG. 2. Also, in some implementations, as noted above, the FET 200 can implement the transistor 100. Accordingly, for purposes of illustration, FIGS. 3-7 are described with further reference to FIGS. 1A, 1B and 2, where appropriate.

Further, because elements of the FET 200 can extend along respective sections (lengths) of the trenches 205 (e.g., shield electrodes, gate electrodes, trenches, etc.), those elements are shown in more than one of the cross-sectional views of the FET 200 illustrated in FIGS. 3-7. For purposes of brevity and clarity, those elements are not described in detail with respect to each view, and only certain elements may be indicated, e.g., for comparison and cross-reference with other views. For instance, in this example, the FET 200 of FIGS. 3-7 is illustrated as being implemented in a semiconductor region 202, and the reference number 202 is indicated in each of the respective views of FIGS. 3-7, though not specifically described or discussed with respect to each view. In some implementations, the semiconductor region 202 can include a doped semiconductor substrate, a doped epitaxial semiconductor layer, a diffused well region, etc. In this example, the semiconductor region 202 can be of n-type conductivity and can include a drain terminal (on a bottom side of the semiconductor region 202) and drift regions 204 of the FET 200 (which, in this example, can be an n-channel, trench-gate FET).

As shown in FIG. 3, each of the trenches 205 (in this cross-sectional view of the first active region 110a of FIG. 2) can have a shield dielectric 242, and the first shield electrode portion 142a (e.g., of the shield electrode 142) disposed in the shield dielectric 242. A dielectric material (e.g., an inter-electrode dielectric material 243, as shown in FIG. 3, can be disposed on the first shield electrode portion 142a, and disposed between the first shield electrode portion 142a and the first gate electrode segment 122a (of the first active region 110a). A gate dielectric layer 222 can be disposed on sidewalls of the trenches 205 (e.g., between the first gate electrode segment 122a and the trench sidewalls.

As shown in FIG. 3, a dielectric 350 (e.g., an interlayer dielectric) can be disposed over the trenches 205 and on an upper surface of the semiconductor region 202 (e.g., on upper surfaces of mesas of the semiconductor region 202 that are defined between the trenches 205). The dielectric 350 can include a first interlayer dielectric 350a and a second interlayer dielectric 350b, which can be separately formed and/or can include different dielectric materials. A metal layer 360 (e.g., source metal in this example) can be disposed on the second interlayer dielectric 350b, as shown in FIG. 3.

The FET 200, as shown in the cross-sectional view of FIG. 3, can also include source and body connections 254 for the FET 200. For instance, the source and body connections 254 of the FET 200 can include a contact 254a (e.g., an Ohmic contact formed through the first interlayer dielectric 350a), and a conductive via 254b (formed through the second interlayer dielectric 350b). In some implementations, the contact 254a and the conductive via 254b can include one or more of a metal (e.g., tungsten, copper, etc.), a metal silicide, and/or other highly conductive materials. As further shown in FIG. 3, the contact 254a and the conductive via 254b can provide electrical interconnection between the (source) metal layer 360 and a source region 254c (e.g., n-type source region), a body region 254d (e.g., p-type body region), and a heavy-body region 254e (e.g., a heavily doped p-type region, to facilitate Ohmic contact formation to the body region 254d). In some implementations, the conductive via 254b can be formed of a same material as the contact 254a (and formed using the same processing operations), can be formed from a same metal as the metal layer 360 (and formed using the same processing operations), or can be formed of a different material than the contact 254a or metal layer 360 (and formed using separate processing operations). Other conductive vias described herein can be similarly produced, depending on the specific implementation.

Referring now to FIG. 4, the cross-sectional view through the first gate contact region 120a of the FET 200 along section line 4-4 in FIG. 2 is shown. As illustrated in FIG. 4, the gate electrodes 122a and the first shield electrode portions 142a extend (as well as the surrounding dielectrics) from the first active region 110a and are also present in the sectional view of FIG. 4. In comparison with FIG. 3, the cross-sectional view of FIG. 4 illustrates the patterned buried conductor layer 250 of the FET 200 (rather than the source and body connections shown in FIG. 3). For instance, FIG. 4 shows the contact portions 224a and the interconnecting segments 224c of the patterned buried conductor layer 250. In some implementations, the patterned buried conductor layer 250 can be formed from a metal, such as tungsten, that is deposited and then planarized to produce the resulting structure of the patterned buried conductor layer 250 shown in FIG. 4. In some implementations, the patterned buried conductor layer 250 can be formed using other approaches, such as sputtering, etching, etc.

As also shown in FIG. 4, the patterned buried conductor layer 250 can be disposed within the dielectric 350 (e.g., disposed between the first interlayer dielectric 350a and the second interlayer dielectric 350b). As illustrated in FIG. 4, a pattern can be etched in the first interlayer dielectric 350a (e.g., using a buried conductor contact mask for the electrical contacts 224a and a partial etch mask for the interconnecting segments 224c), and the patterned buried conductor layer 250 can be disposed in that etched patterned. As further shown in FIG. 4, the second interlayer dielectric 350b electrically insulates the patterned buried conductor layer 250 from the source metal 360. In some implementations, electrical connections for providing a gate signal to the FET 200 can be made to the gate electrode segments of the FET 200 and/or to the patterned buried conductor layer 250, where the patterned buried conductor layer 250 can provide electrical connections between a plurality of gate electrode segments of the FET 200 (e.g., gate electrode segments of the first active region 110a and of the second active region 110b). For instance, the patterned buried conductor layer 250 can electrically interconnect a portion of, or all of the gate electrode segments of a given implementation of the FET 200 (or gate electrode segments of transistor devices having other configurations, such as trench-gate IGBTs).

Referring now to FIG. 5, the cross-sectional view through the first gate contact region 120a of the FET 200 along section line 5-5 in FIG. 2 is shown. As shown in FIG. 2, the section of FIG. 5 (along section line 5-5) is offset from the section of FIG. 4 (along section line 4-4). That is, the section of FIG. 5 is through the electrical contacts 224a of the patterned buried conductor layer 250 and through the interconnecting segments 224b (rather than through the electrical contacts 224a and the interconnecting segments 224c, as in FIG. 4). Accordingly, as illustrated in FIG. 5, the electrical contacts 224a to the first gate electrode segments 122a are shown, as are the interconnecting segments 224b (with no connection between the electrical contacts 224a and the interconnecting segments 224b in this sectional view). For purposes of this disclosure, the interconnecting segments 224b (e.g., as shown in FIG. 5) can be referred to as floating interconnects, e.g., based on their visual appearance of floating within the dielectric 350. As noted above with respect to the patterned buried conductor layer 250, as also shown in FIG. 5, the second interlayer dielectric 350b electrically insulates the electrical contacts 224a and interconnecting segments 224b from the source metal 360 in the first gate contact region 120a.

Referring now to FIG. 6, the cross-sectional view through the first isolation region 130a of the FET 200 along section line 6-6 in FIG. 2 is shown. As shown in FIG. 2, the section of FIG. 6 (along section line 6-6) is through the interconnecting segments 224b and also through the area of the FET 200 where the mask 230 (e.g., along with the mask 240), defines the areas of the trenches 205 in which an isolation dielectric 643 is formed (disposed, etc.). In this example, the isolation dielectric 643 electrically isolates the electrical contacts 224a to the gate electrodes 122a from respective shield contacts 244 (e.g., in the shield contact region 140). Accordingly, as illustrated in FIG. 6, the interconnecting segments 224b of the patterned buried conductor layer 250 are shown, and other portions of the patterned buried conductor layer 250 are not present in the section (as can be seen in FIG. 2 with respect to the section line 6-6). In example implementations, the isolation dielectric 643 can be formed separately from, or in conjunction with other dielectric materials of the FET 200. Further, as noted above with respect to the patterned buried conductor layer 250, as also shown in FIG. 6, the second interlayer dielectric 350b electrically insulates the interconnecting segments 224b from the source metal 360 in the first isolation region 130a.

Referring now to FIG. 7, the cross-sectional view through the shield contact region 140 of the FET 200 along section line 7-7 in FIG. 2 is shown. As shown in FIG. 2, the cross-sectional view of FIG. 7 (along section line 7-7) is through the interconnecting segments 224b and also through the shield contacts 244, as is illustrated by FIG. 7. In this example, the shield contacts 244 of the FET 200 can include an Ohmic contact 244a (e.g., an Ohmic contact to the shield electrode 142 (e.g., to the second shield electrode portion 142b) formed through the first interlayer dielectric 350a), and a conductive via 244b (formed through the second interlayer dielectric 350b). In some implementations, the Ohmic contact 244a and the conductive via 244b can include one or more of a metal (e.g., tungsten, copper, etc.), a metal silicide, and/or other highly conductive materials. As further shown in FIG. 7, the Ohmic contact 244a and the conductive via 244b can provide electrical interconnection between the (source) metal layer 360 and the shield electrodes 244 (e.g., via second shield electrode portions 142b).

FIGS. 8A-12D are cross-sectional views illustrating semiconductor processing operations (e.g., respectively along the same section lines of FIGS. 3-7) for producing the implementation of the FET 200 of FIGS. 3-7. For instance, FIGS. 8A-8D correspond with FIG. 3, and so forth. The processing operations illustrated by FIGS. 8A-12D can be, in the context of this disclosure, referred to as back-end processing operations. For instance, the sequences of processing operations illustrated by FIGS. 8A-12D are processing operations that are performed, in this example, after the formation of the first interlayer dielectric 350a for an example implementation of the FET 200. In other words, the processing operations of FIGS. 8A-12D begin after shield electrodes, gate electrodes, dielectrics within the trenches (e.g., including the isolation dielectric 643), body regions and source regions have already been formed. For purposes of cross-reference and comparison with the cross-sectional views of FIGS. 3-7, the cross-sectional views of FIGS. 8A-12D reference elements from those views, though those elements may not be specifically discussed with respect to FIGS. 8A-12D.

Figure 8A:
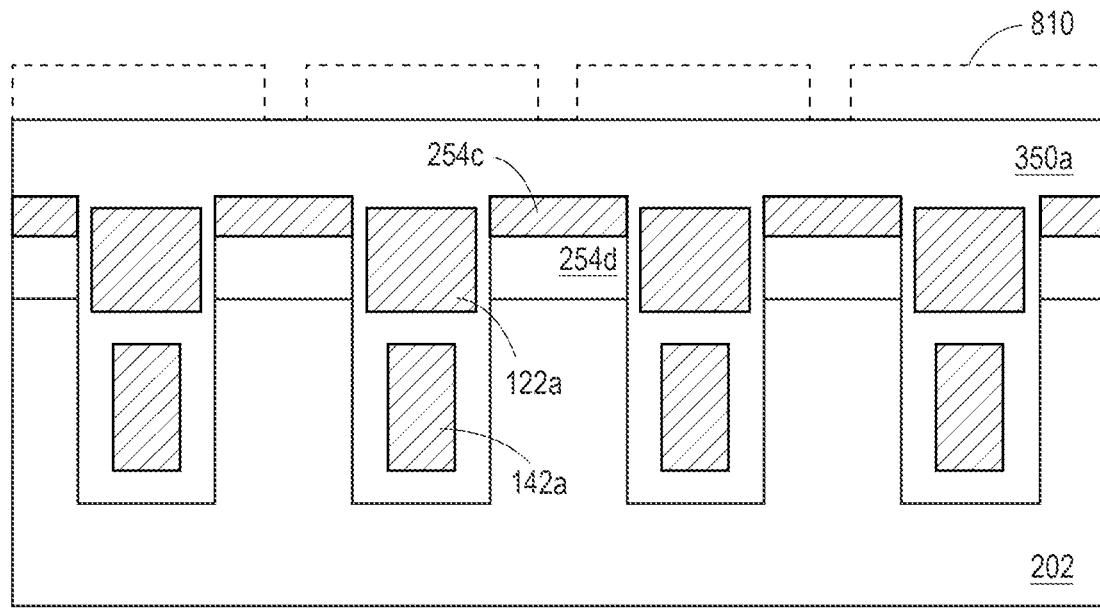
FIGS. 8A-8D are cross-sectional diagrams, corresponding with the cross-sectional view of FIG. 3, that illustrate semiconductor processing operations for producing an implementation of trench-gate FET of FIGS. 3-7.
Figure 8B:
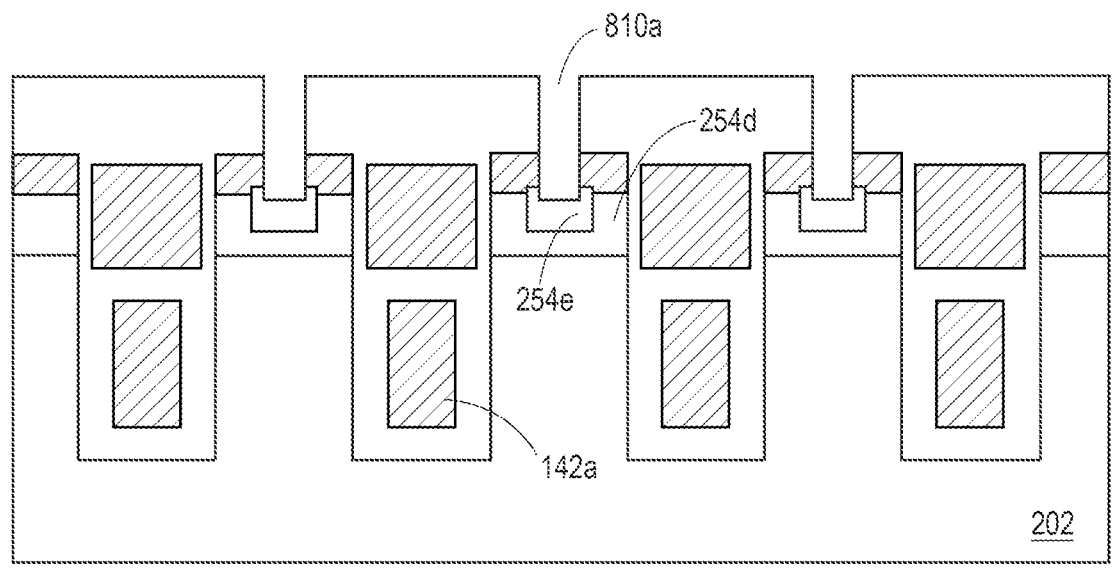

FIGS. 8A-8D are cross-sectional diagrams corresponding with the cross-sectional view of FIG. 3 (e.g., in the first active region 110a of the FET 200), that illustrate semiconductor processing operations for producing an implementation of trench-gate FET of FIGS. 3-7. As shown in FIG. 8A, a contact mask (a photolithography mask) can be used to produce an etch mask 810 for defining source and body contact openings 810a (as well as gate and shield contact openings, as shown in FIGS. 12A-12D). As shown in FIG. 8B, an etch can be performed, based on the etch mask 810 to form the contact openings 810a through the first interlayer dielectric 350a, to the source regions 254c and the body regions 254d. As also shown in FIG. 8B, an implant operation can be performed to form the heavy-body regions 254e in the body regions 254d.

Figure 8C:
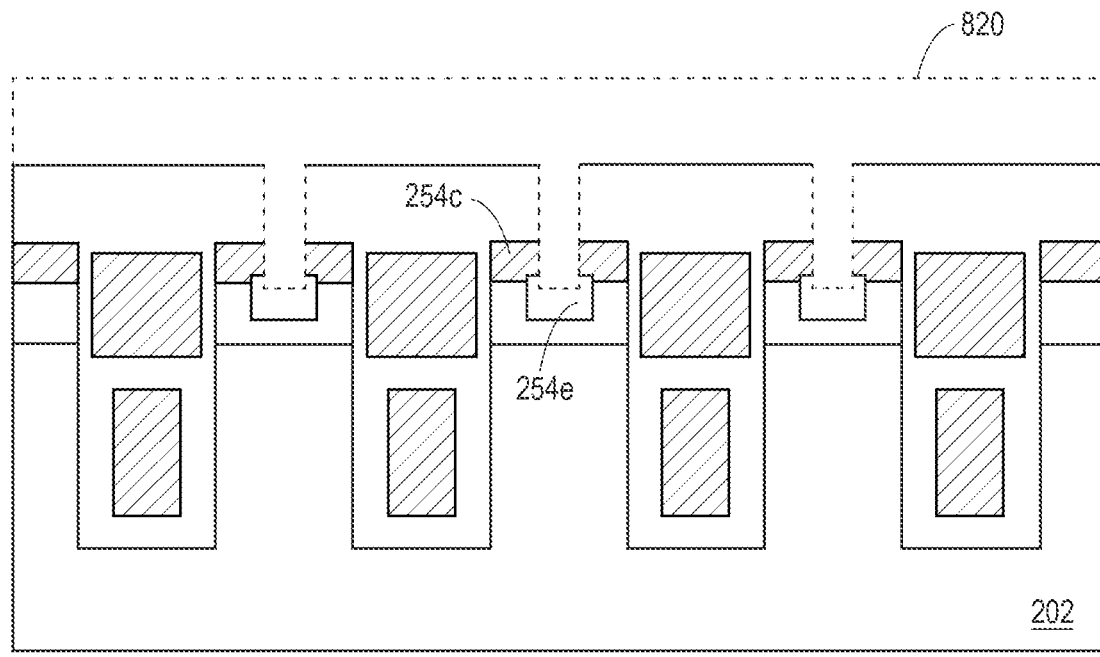
Figure 8D:
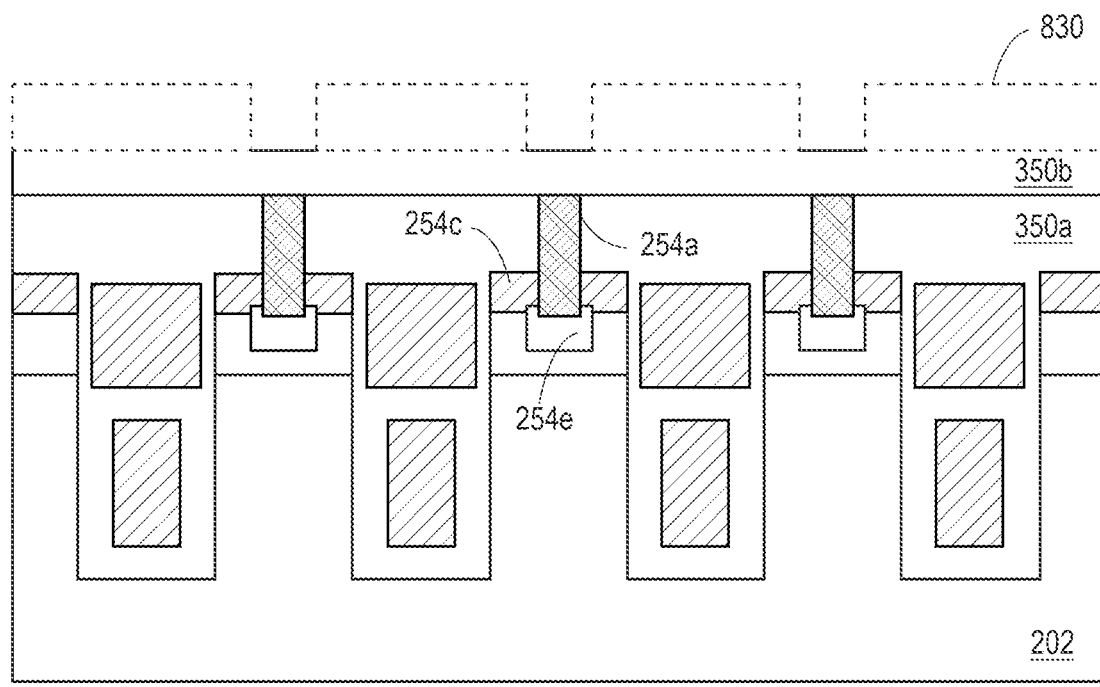
Figure 9A:
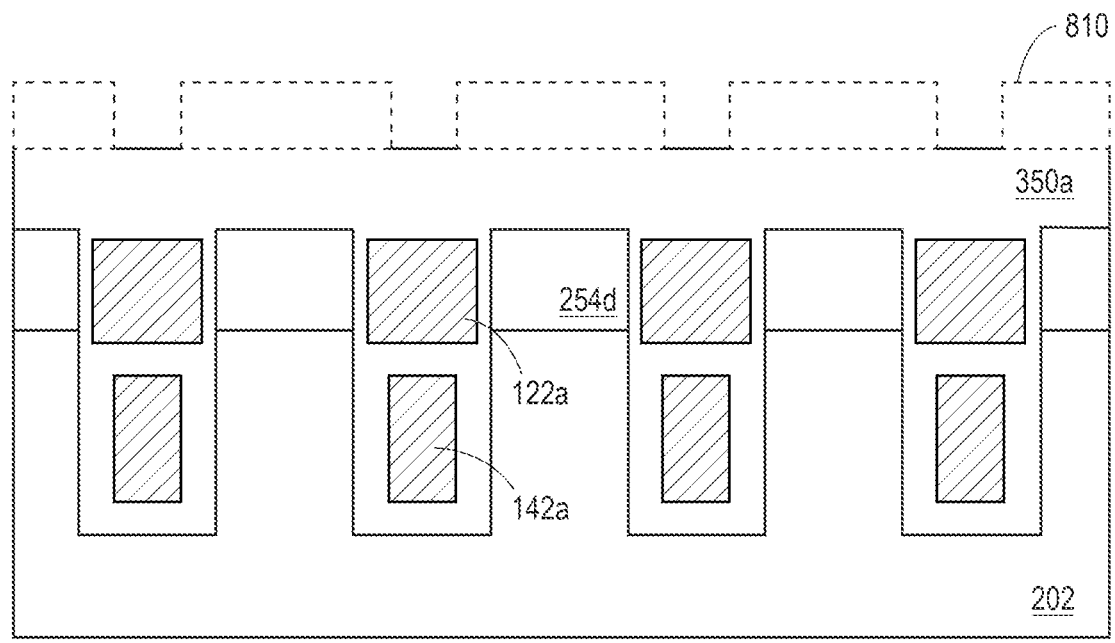
FIGS. 9A-9C are cross-sectional diagrams, corresponding with the cross-sectional view of FIG. 4, that illustrate semiconductor processing operations for producing the trench-gate FET of FIGS. 3-7.
Figure 9B:
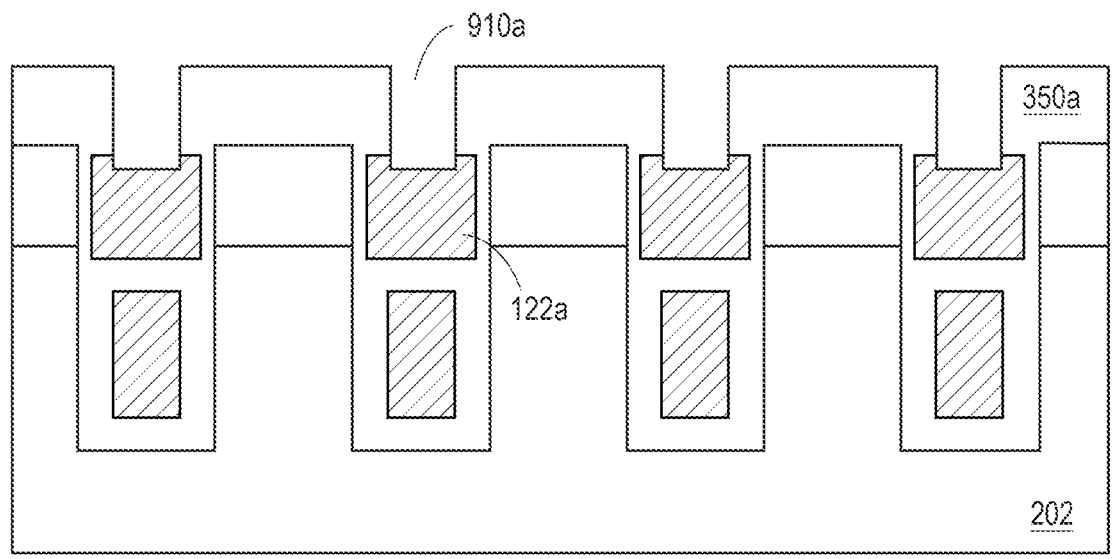

As shown in FIG. 8C, another mask can be used to form an etch mask 820 that covers the first active region 110a, such that no etching is performed in the first active region 110a based on the etch mask 820. In this example, etch mask 820 (as shown in FIGS. 9A and 9B) can be used to form the patterned buried conductor layer 250. FIG. 8D illustrates that, after removal of the etch mask 820, the contacts 254a can be formed in the source body contact openings 810a, and the second interlayer dielectric 350b can be formed. In some implementations, these processing operations can be performed in other orders. For instance, in some implementations, the contacts 254a can be formed prior to forming the etch mask 820 and the second interlayer dielectric 350b. FIG. 8D, in this example, also illustrates an etch mask 830 that can be used to form the conductive vias 254b of the source and body connections 254 through the second interlayer dielectric 350b. After an etch to form via openings, the conductive vias 254b, and the metal layer 360 of FIG. 3 can be formed to result in the structure shown in FIG. 3.

Figure 9C:
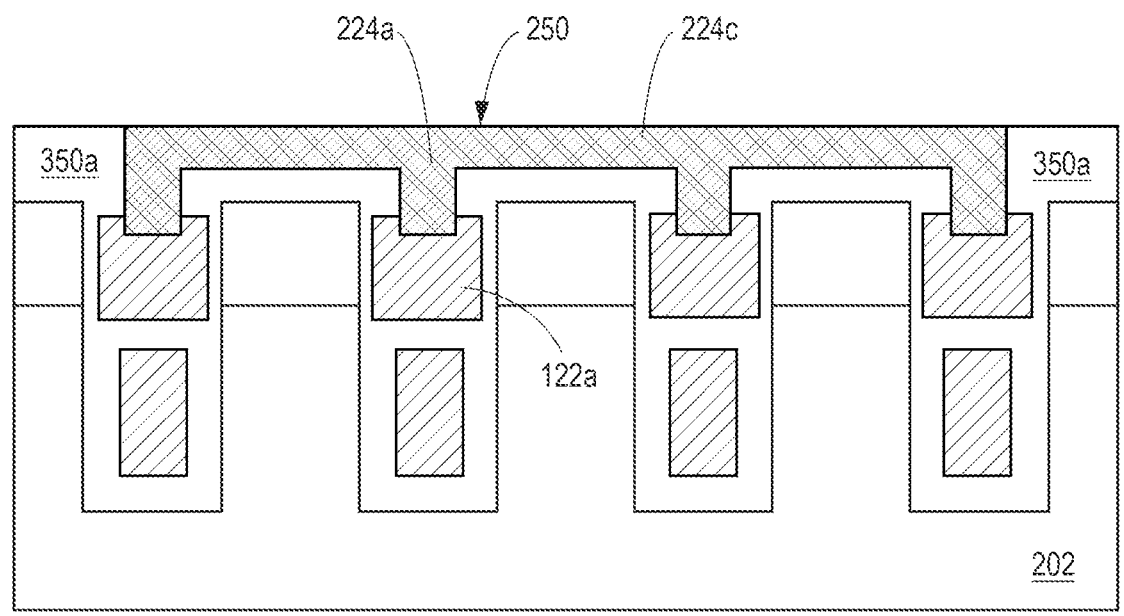

FIGS. 9A-9C are cross-sectional diagrams corresponding with the sectional view of FIG. 4 (e.g., in the first gate contact region 120a of the FET 200), that illustrate semiconductor processing operations for producing an implementation of trench-gate FET of FIGS. 3-7. As shown in FIGS. 9A and 9B, the etch mask 810 can be used to define buried contact openings 910a in the first interlayer dielectric 350a for the patterned buried conductor layer 250. As shown in a FIG. 9C, the etch mask 820 of FIG. 8C (not shown in FIGS. 9A-9C) can be used to perform a partial etch of the first interlayer dielectric 350a (further illustrated in FIG. 10A) to define the areas of the first interlayer dielectric 350a where the interconnecting segments 224c of the patterned buried conductor layer 250 are formed in the FET 200. As also shown in FIG. 9C, the patterned buried conductor layer 250 can be formed in the etched pattern formed in the dielectric 350a, e.g., using a tungsten deposition and a chemical-mechanical polishing process. After producing (forming, etc.) the patterned buried conductor layer 250, the second interlayer dielectric 350b, and the metal layer 360 of FIG. 4 can be formed to result in structure shown in FIG. 4.

Figure 10A:
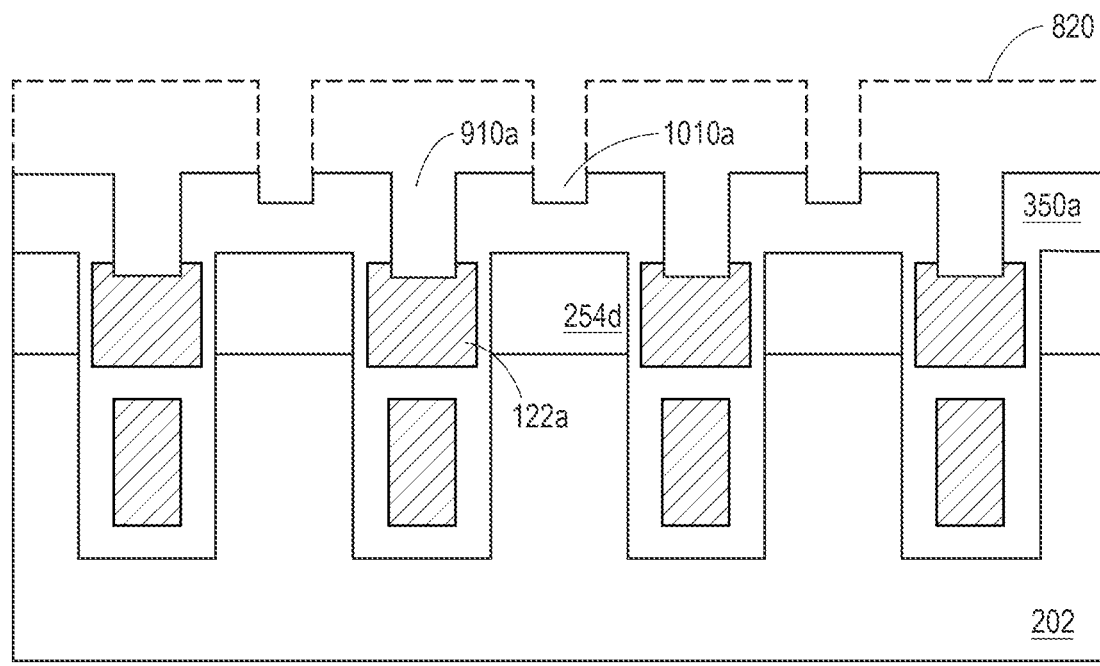
FIGS. 10A-10B are cross-sectional diagrams, corresponding with the cross-sectional view of FIG. 5, that illustrate semiconductor processing operations for producing the trench-gate FET of FIGS. 3-7.
Figure 10B:
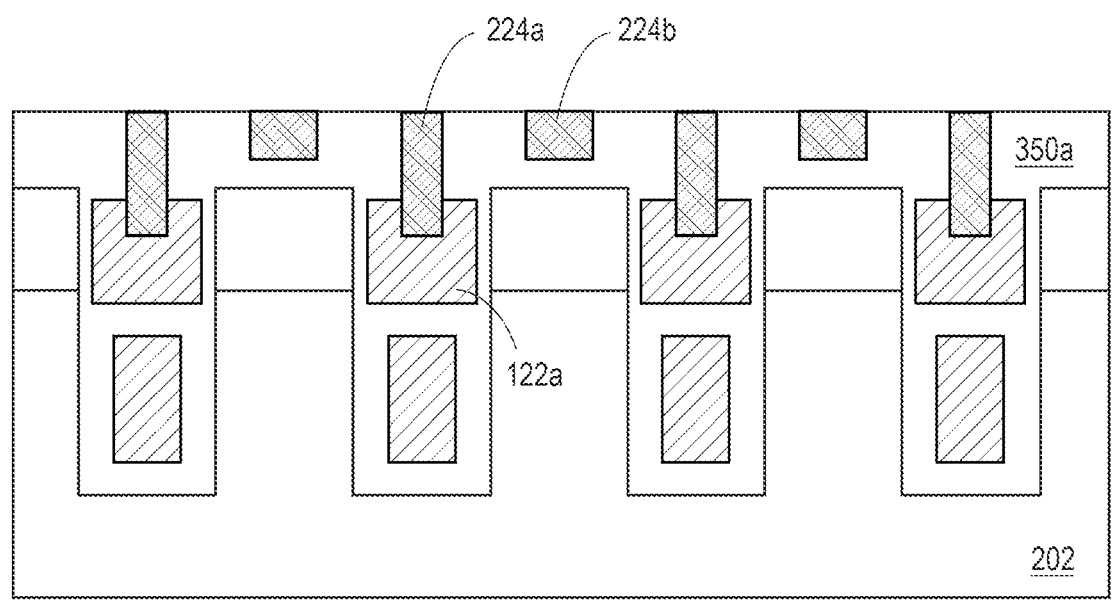

FIGS. 10A-10B are cross-sectional diagrams corresponding with the sectional view of FIG. 5 (e.g., in the first gate contact region 120a of the FET 200), that illustrate semiconductor processing operations for producing an implementation of trench-gate FET of FIGS. 3-7. As shown in FIG. 10A, buried contact openings, as defined by the etch mask 810 of FIG. 8A are already formed. As shown in FIGS. 10A and 10B, the etch mask 820 can then be used to define a partial etch pattern 1010a in the first interlayer dielectric 350a (e.g., for formation of the interconnecting segments 224b and 224c of the patterned buried conductor layer 250). As shown in a FIG. 10B, the electrical contacts 224a and interconnecting segments 224b of the patterned buried conductor layer 250 can be formed (e.g., using the process discussed above with respect to FIG. 9C.) After producing (forming, etc.) the patterned buried conductor layer 250, the second interlayer dielectric 350b, and the metal layer 360 of FIG. 5 can be formed to result in structure shown in FIG. 5.

Figure 11A:
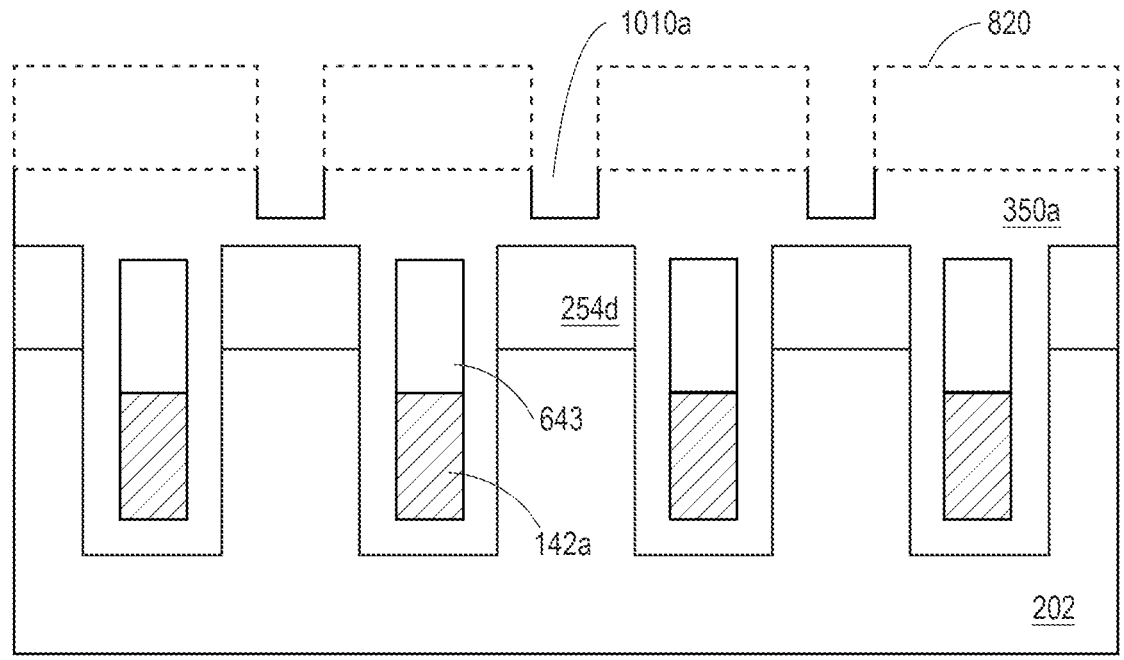
FIGS. 11A-11B are cross-sectional diagrams, corresponding with the cross-sectional view of FIG. 6, that illustrate semiconductor processing operations for producing the trench-gate FET of FIGS. 3-7.
Figure 11B:
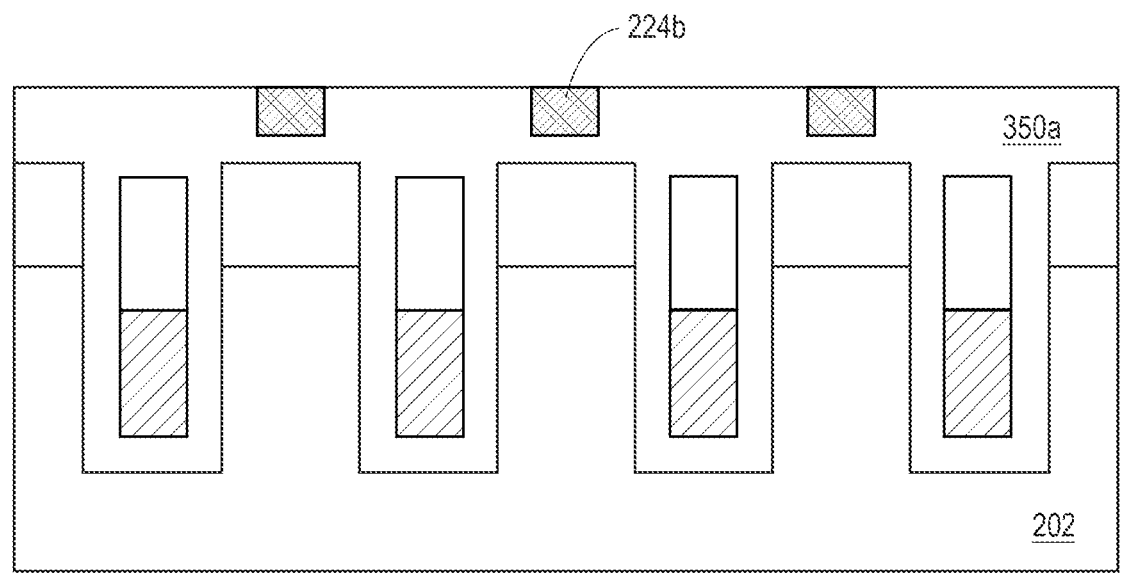

FIGS. 11A-11B are cross-sectional diagrams corresponding with the sectional view of FIG. 6 (e.g., in the first isolation region 130a of the FET 200), that illustrate semiconductor processing operations for producing an implementation of trench-gate FET of FIGS. 3-7. As shown in FIG. 11A, the etch mask 820 can be used to define portions of the partial etch pattern 1010a in the first interlayer dielectric 350a (e.g., for formation of the interconnecting segments 224b of the patterned buried conductor layer 250). As shown in a FIG. 11B, the interconnecting segments 224b of the patterned buried conductor layer 250 can be formed (e.g., using the process discussed above with respect to FIG. 9C.) After producing (forming, etc.) the patterned buried conductor layer 250, the second interlayer dielectric 350b, and the metal layer 360 of FIG. 6 can be formed to result in structure shown in FIG. 6.

Figure 12A:
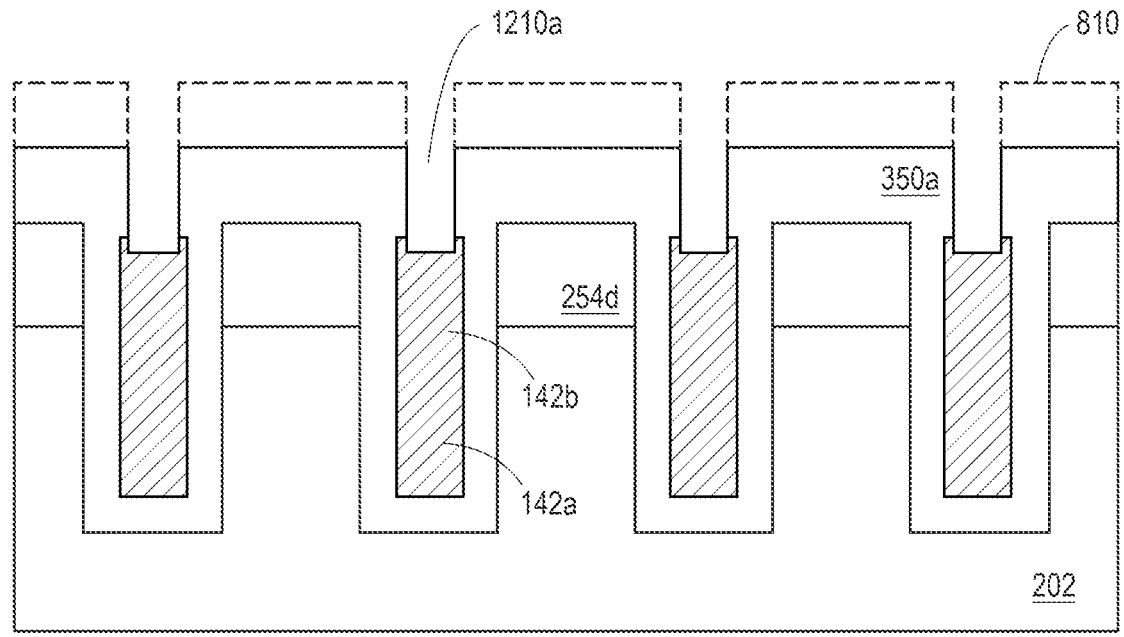
FIGS. 12A-12D are cross-sectional diagrams, corresponding with the cross-sectional view of FIG. 7, that illustrate semiconductor processing operations for producing the trench-gate FET of FIGS. 3-7.
Figure 12B:
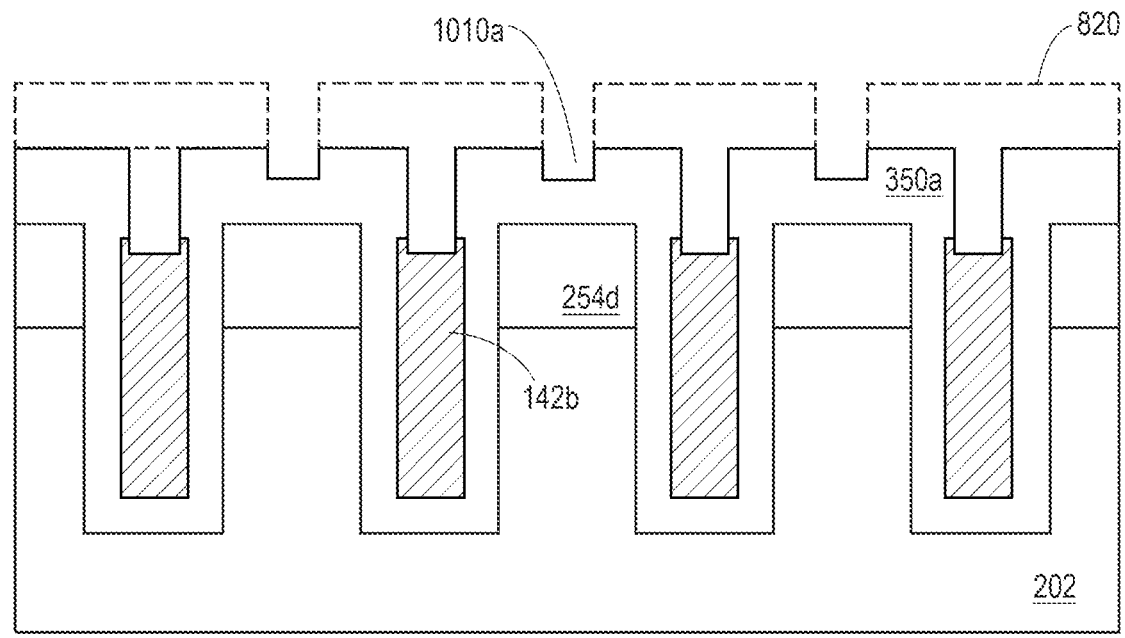

FIGS. 12A-12D are cross-sectional diagrams corresponding with the cross-sectional view of FIG. 7 (e.g., in the shield contact region 140 of the FET 200), that illustrate semiconductor processing operations for producing an implementation of trench-gate FET of FIGS. 3-7. As shown in FIG. 12A, the etch mask 810 (contact mask) can be used to define shield contact openings 1210a. As shown in FIG. 12B, the etch mask 820 can be used to define portions of the partial etch pattern 1010a in the first interlayer dielectric 350a (e.g., for formation of the interconnecting segments 224b of the patterned buried conductor layer 250).

Figure 12C:
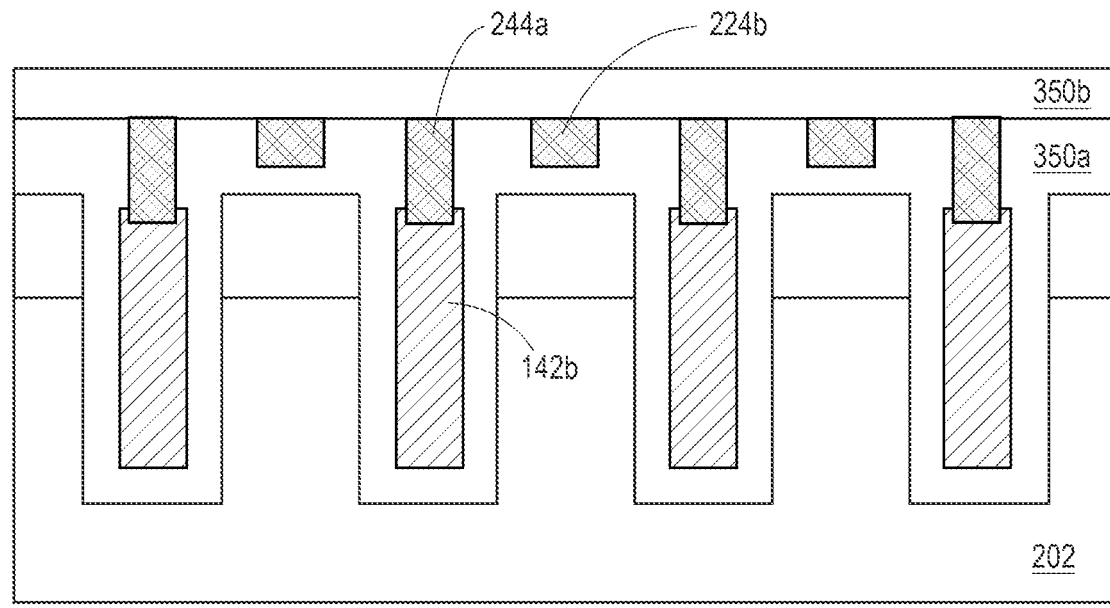
Figure 12D:
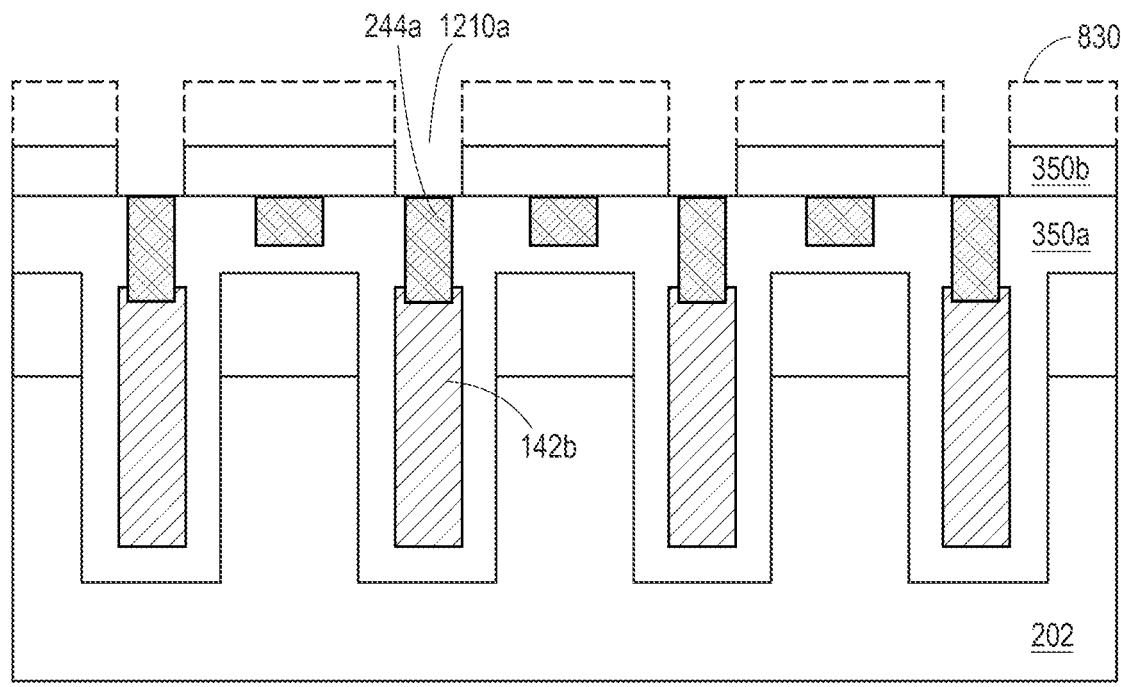

As shown in FIG. 12C, the ohmic contacts 244a and the interconnecting segments 224b can be formed, and the dielectric 350b can be formed over those structures, as well as the first interlayer dielectric 350a. FIG. 12D illustrates that the etch mask 830 can be used to form openings 1210a for the conductive vias 244b of the shield contacts 244 through the second interlayer dielectric 350b. After the etch of FIG. 12D, the conductive vias 244b and the metal layer 360 of FIG. 7 can be formed to result in the structure shown in FIG. 7.

In a general aspect, a transistor can include a semiconductor region, a trench disposed in the semiconductor region, and a gate electrode disposed in an upper portion of the trench. The gate electrode can include a first gate electrode segment and a second gate electrode segment. The transistor can further include a shield electrode having a first shield electrode portion disposed in a lower portion of the trench, and a second shield electrode portion orthogonally extending from the first shield electrode portion in the lower portion of the trench to the upper portion of the trench. The first shield electrode portion can be disposed below the first gate electrode segment and the second gate electrode segment. The second shield electrode portion can be disposed between the first gate electrode segment and the second gate electrode segment. The transistor can also include a patterned buried conductor layer. The first gate electrode segment can being electrically coupled with the second gate electrode segment via the patterned buried conductor layer.

Implementations can include one or more of the following features. For example, the transistor can include a first dielectric layer electrically isolating the first shield electrode portion from the first gate electrode segment, and electrically isolating the first shield electrode portion from the second gate electrode segment. The device can include a second dielectric layer disposed on an upper surface of the semiconductor region and over the trench, the patterned buried conductor layer can be disposed in the second dielectric layer. The second dielectric layer can include a first interlayer dielectric disposed on the upper surface of the semiconductor region and over the trench. The patterned buried conductor layer can be disposed in an etched pattern in the first interlayer dielectric. The second dielectric can also include a second interlayer dielectric disposed on the first interlayer dielectric and the patterned buried conductor layer.

The transistor can include a signal metal layer coupled with a source terminal of the transistor, and an electrical contact electrically coupling the signal metal layer to the second shield electrode portion. The electrical contact can be electrically insulated from the patterned buried conductor layer by the second dielectric layer.

The transistor can include a first electrical contact electrically coupling the patterned buried conductor layer to the first gate electrode segment, and a second electrical contact electrically coupling the patterned buried conductor layer to the second gate electrode segment.

A portion of the patterned buried conductor layer can be arranged in parallel with the trench. The portion of the patterned buried conductor layer can be laterally spaced away from the trench. The patterned buried conductor layer can include one or more of a metal, a metal silicide, or doped polysilicon. The patterned buried conductor layer can be formed from a single conductive material layer.

In another general aspect, a transistor can include a semiconductor region; a first active region disposed in the semiconductor region. The first active region can include a first active segment of the transistor. The transistor can further include a first gate contact region disposed in the semiconductor region and adjacent to the first active region; a first isolation region disposed in the semiconductor region and adjacent to the first gate contact region, the first gate contact region being disposed between the first active region and the first isolation region; a shield contact region disposed in the semiconductor region and adjacent to the first isolation region, the first isolation region being disposed between the first gate contact region and the shield contact region; a second isolation region disposed in the semiconductor region and adjacent to the shield contact region, the shield contact region being disposed between the first isolation region and the second isolation region; a second gate contact region disposed in the semiconductor region and adjacent to the second isolation region, the second isolation region being disposed between the shield contact region and the second isolation region; a second active region disposed in the semiconductor region, the second gate contact region being disposed between the second isolation region and the second active region, the second active region including a second active segment of the transistor; a trench disposed in the semiconductor region, the trench extending from the first active region to the second active region; and a gate electrode disposed in an upper portion of the trench. The gate electrode can include a first gate electrode segment, and a second gate electrode segment. The transistor can also include a shield electrode having a first shield electrode portion disposed in a lower portion of the trench, the first shield electrode portion being disposed below the first gate electrode segment and the second gate electrode segment, and a second shield electrode portion orthogonally extending from the first shield electrode portion in the lower portion of the trench to the upper portion of the trench. The second shield electrode portion can be disposed between the first gate electrode segment and the second gate electrode segment. The transistor can further include a patterned buried conductor layer, the first gate electrode segment being electrically coupled with the second gate electrode segment via the patterned buried conductor layer.

Implementations can include one or more of the following features. For example, the first gate electrode segment can extend from the first gate contact region to the first active region. The second gate electrode segment can extend from the second gate contact region to the second active region.

The transistor can include a first dielectric layer electrically isolating the first shield electrode portion from the first gate electrode segment, and electrically isolating the first shield electrode portion from the second gate electrode segment. The transistor can include a second dielectric layer disposed on an upper surface of the semiconductor region and over the trench. The patterned buried conductor layer can be disposed in the second dielectric layer. The second dielectric layer can include a first interlayer dielectric disposed on the upper surface of the semiconductor region and over the trench. The patterned buried conductor layer can be disposed in an etched pattern in the first interlayer dielectric. The second dielectric layer can also include a second interlayer dielectric disposed on the first interlayer dielectric and the patterned buried conductor layer.

The transistor can include a signal metal layer coupled with a source terminal of the transistor; and an electrical contact electrically coupling the signal metal layer to the second shield electrode portion. The electrical contact can be electrically insulated from the patterned buried conductor layer by the second dielectric layer.

The transistor can include a first electrical contact electrically coupling the patterned buried conductor layer to the first gate electrode segment, and a second electrical contact electrically coupling the patterned buried conductor layer to the second gate electrode segment.

A portion of the patterned buried conductor layer can be arranged in parallel with the trench. The portion of the patterned buried conductor layer can be laterally spaced away from the trench.

The transistor can further include a dielectric material that can be disposed on the first shield electrode portion, disposed between the first gate electrode segment and the second shield electrode portion, and disposed between the second gate electrode segment and the second shield electrode portion, The dielectric material can electrically isolate the shield electrode from the first gate electrode segment and the second gate electrode segment.

In another general aspect, a method can include forming a trench in a semiconductor region, and forming a shield electrode in the trench. The shield electrode can include a first shield electrode portion disposed in a lower portion of the trench, the first shield electrode portion, and a second shield electrode portion orthogonally extending from the first shield electrode portion in the lower portion of the trench to an upper portion of the trench. The method can further include forming a gate electrode in the upper portion of the trench. The gate electrode can include a first gate electrode segment disposed above the first shield electrode portion, and a second gate electrode segment disposed above the first shield electrode portion. The second shield electrode portion can being disposed between the first gate electrode segment and the second gate electrode segment. The method can also include forming a patterned buried conductor layer. The first gate electrode segment can be electrically coupled with the second gate electrode segment via the patterned buried conductor layer.

Implementations can include one or more of the following features. For example, forming the patterned buried conductor layer can include patterning a single conductive material layer.

The method can include forming a first electrical contact electrically coupling the patterned buried conductor layer to the first gate electrode segment, and forming a second electrical contact electrically coupling the patterned buried conductor layer to the second gate electrode segment.

A portion of the patterned buried conductor layer can be arranged in parallel with the trench. The portion of the patterned buried conductor layer can be laterally spaced away from the trench.

It will be understood, for purposes of this disclosure, that when an element, such as a layer, a region, or a substrate, is referred to as being on, disposed on, connected to, electrically connected to, coupled to, or electrically coupled to another element, it may be directly on, connected or coupled to the other element, or one or more intervening elements may be present. In contrast, when an element is referred to as being directly on, directly disposed on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A transistor comprising:
a semiconductor region;
a trench disposed in the semiconductor region;
a gate electrode disposed in an upper portion of the trench, the gate electrode including:
a first gate electrode segment; and
a second gate electrode segment;
a shield electrode having:
a first shield electrode portion disposed in a lower portion of the trench, the first shield electrode portion being disposed below the first gate electrode segment and the second gate electrode segment; and
a second shield electrode portion orthogonally extending from the first shield electrode portion in the lower portion of the trench to the upper portion of the trench, the second shield electrode portion being disposed between the first gate electrode segment and the second gate electrode segment; and
a patterned buried conductor layer, the first gate electrode segment being electrically coupled with the second gate electrode segment via the patterned buried conductor layer.

2. The transistor of claim 1, further comprising:
a first dielectric layer electrically isolating the first shield electrode portion from the first gate electrode segment, and electrically isolating the first shield electrode portion from the second gate electrode segment; and
a second dielectric layer disposed on an upper surface of the semiconductor region and over the trench, the patterned buried conductor layer being disposed in the second dielectric layer.

3. The transistor of claim 2, wherein the second dielectric layer includes:
a first interlayer dielectric disposed on the upper surface of the semiconductor region and over the trench, the patterned buried conductor layer being disposed in an etched pattern in the first interlayer dielectric; and
a second interlayer dielectric disposed on the first interlayer dielectric and the patterned buried conductor layer.

4. The transistor of claim 2, further comprising:
a signal metal layer coupled with a source terminal of the transistor; and
an electrical contact electrically coupling the signal metal layer to the second shield electrode portion, the electrical contact being electrically insulated from the patterned buried conductor layer by the second dielectric layer.

5. The transistor of claim 1, further comprising:
a first electrical contact electrically coupling the patterned buried conductor layer to the first gate electrode segment; and
a second electrical contact electrically coupling the patterned buried conductor layer to the second gate electrode segment.

6. The transistor of claim 1, wherein a portion of the patterned buried conductor layer is arranged in parallel with the trench, the portion of the patterned buried conductor layer being laterally spaced away from the trench.

7. The transistor of claim 1, wherein the patterned buried conductor layer includes one or more of a metal, a metal silicide, or doped polysilicon.

8. The transistor of claim 1, wherein the patterned buried conductor layer is formed from a single conductive material layer.

9. A transistor comprising:
a semiconductor region;
a first active region disposed in the semiconductor region, the first active region including a first active segment of the transistor;
a first gate contact region disposed in the semiconductor region and adjacent to the first active region;
a first isolation region disposed in the semiconductor region and adjacent to the first gate contact region, the first gate contact region being disposed between the first active region and the first isolation region;
a shield contact region disposed in the semiconductor region and adjacent to the first isolation region, the first isolation region being disposed between the first gate contact region and the shield contact region;
a second isolation region disposed in the semiconductor region and adjacent to the shield contact region, the shield contact region being disposed between the first isolation region and the second isolation region;
a second gate contact region disposed in the semiconductor region and adjacent to the second isolation region, the second isolation region being disposed between the shield contact region and the second isolation region;
a second active region disposed in the semiconductor region, the second gate contact region being disposed between the second isolation region and the second active region, the second active region including a second active segment of the transistor;
a trench disposed in the semiconductor region, the trench extending from the first active region to the second active region;
a gate electrode disposed in an upper portion of the trench, the gate electrode including:
a first gate electrode segment; and
a second gate electrode segment;
a shield electrode having:
a first shield electrode portion disposed in a lower portion of the trench, the first shield electrode portion being disposed below the first gate electrode segment and the second gate electrode segment; and
a second shield electrode portion orthogonally extending from the first shield electrode portion in the lower portion of the trench to the upper portion of the trench, the second shield electrode portion being disposed between the first gate electrode segment and the second gate electrode segment; and
a patterned buried conductor layer, the first gate electrode segment being electrically coupled with the second gate electrode segment via the patterned buried conductor layer.

10. The transistor of claim 9, wherein:
the first gate electrode segment extends from the first gate contact region to the first active region; and
the second gate electrode segment extends from the second gate contact region to the second active region.

11. The transistor of claim 9, further comprising:
a first dielectric layer electrically isolating the first shield electrode portion from the first gate electrode segment, and electrically isolating the first shield electrode portion from the second gate electrode segment; and a second dielectric layer disposed on an upper surface of the semiconductor region and over the trench, the patterned buried conductor layer being disposed in the second dielectric layer.

12. The transistor of claim 11, wherein the second dielectric layer includes:
a first interlayer dielectric disposed on the upper surface of the semiconductor region and over the trench, the patterned buried conductor layer being disposed in an etched pattern in the first interlayer dielectric; and
a second interlayer dielectric disposed on the first interlayer dielectric and the patterned buried conductor layer.

13. The transistor of claim 11, further comprising:
a signal metal layer coupled with a source terminal of the transistor; and
an electrical contact electrically coupling the signal metal layer to the second shield electrode portion, the electrical contact being electrically insulated from the patterned buried conductor layer by the second dielectric layer.

14. The transistor of claim 9, further comprising:
a first electrical contact electrically coupling the patterned buried conductor layer to the first gate electrode segment; and
a second electrical contact electrically coupling the patterned buried conductor layer to the second gate electrode segment.

15. The transistor of claim 9, wherein a portion of the patterned buried conductor layer is arranged in parallel with the trench, the portion of the patterned buried conductor layer being laterally spaced away from the trench.

16. The transistor of claim 9, further comprising:
a dielectric material, the dielectric material being:
disposed on the first shield electrode portion;
disposed between the first gate electrode segment and the second shield electrode portion; and
disposed between the second gate electrode segment and the second shield electrode portion,
the dielectric material electrically isolating the shield electrode from the first gate electrode segment and the second gate electrode segment.

17. A method for forming a transistor, the method comprising:
forming a trench in a semiconductor region;
forming a shield electrode in the trench, the shield electrode including:
a first shield electrode portion disposed in a lower portion of the trench; and
a second shield electrode portion orthogonally extending from the first shield electrode portion in the lower portion of the trench to an upper portion of the trench;
forming a gate electrode in the upper portion of the trench, the gate electrode including:
a first gate electrode segment disposed above the first shield electrode portion; and
a second gate electrode segment disposed above the first shield electrode portion, the second shield electrode portion being disposed between the first gate electrode
segment and the second gate electrode segment; and
forming a patterned buried conductor layer, the first gate electrode segment being electrically coupled with the second gate electrode segment via the patterned buried conductor layer.

18. The method of claim 17, wherein forming the patterned buried conductor layer includes patterning a single conductive material layer.

19. The method of claim 17, further comprising:
forming a first electrical contact electrically coupling the patterned buried conductor layer to the first gate electrode segment; and
forming a second electrical contact electrically coupling the patterned buried conductor layer to the second gate electrode segment.

20. The method of claim 17, wherein a portion of the patterned buried conductor layer is arranged in parallel with the trench, the portion of the patterned buried conductor layer being laterally spaced away from the trench.

* * * * *